United States Patent
Ikeda et al.

(10) Patent No.: US 7,743,278 B2
(45) Date of Patent: Jun. 22, 2010

(54) TEST ACCESS CONTROL FOR PLURAL PROCESSORS OF AN INTEGRATED CIRCUIT

(75) Inventors: Yuri Ikeda, Tokyo (JP); Yoshikazu Aoto, Tokyo (JP); Jun Matsushima, Tokyo (JP); Hiroyuki Sasaki, Tokyo (JP); Tomoyoshi Ujii, Tokyo (JP); Makoto Saen, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 834 days.

(21) Appl. No.: 11/600,208

(22) Filed: Nov. 16, 2006

(65) Prior Publication Data

US 2007/0226558 A1    Sep. 27, 2007

(30) Foreign Application Priority Data

Nov. 28, 2005    (JP) .............................. 2005-341958

(51) Int. Cl.
*G06F 11/00* (2006.01)

(52) U.S. Cl. .......................................... 714/27; 714/30
(58) Field of Classification Search ...................... None
See application file for complete search history.

(56) References Cited

U.S. PATENT DOCUMENTS

| | | | | |
|---|---|---|---|---|
| 6,073,254 | A * | 6/2000 | Whetsel | 714/30 |
| 6,324,662 | B1 * | 11/2001 | Haroun et al. | 714/724 |
| 6,334,198 | B1 * | 12/2001 | Adusumilli et al. | 714/727 |
| 6,675,284 | B1 * | 1/2004 | Warren | 712/38 |
| 6,686,759 | B1 * | 2/2004 | Swamy | 324/765 |
| 6,691,289 | B2 * | 2/2004 | Chae et al. | 716/4 |
| 6,829,730 | B2 * | 12/2004 | Nadeau-Dostie et al. | 714/30 |
| 6,918,058 | B2 * | 7/2005 | Miura et al. | 714/30 |
| 6,973,592 | B2 * | 12/2005 | Debling | 714/30 |
| 7,010,722 | B2 * | 3/2006 | Jahnke | 714/30 |
| 7,139,947 | B2 * | 11/2006 | Miner et al. | 714/726 |
| 7,398,440 | B2 * | 7/2008 | Warren | 714/724 |
| 7,536,597 | B2 * | 5/2009 | McGowan | 714/30 |
| 2004/0163012 | A1 | 8/2004 | Hayase | |

FOREIGN PATENT DOCUMENTS

JP       2004-164367 A    6/2004

* cited by examiner

*Primary Examiner*—Gabriel L Chu
(74) *Attorney, Agent, or Firm*—Miles & Stockbridge P.C.

(57) ABSTRACT

The present invention is directed to facilitate debugging in a semiconductor integrated circuit device including a plurality of microprocessors. A semiconductor integrated circuit device includes: a plurality of processors; a plurality of debug interfaces enabling debugging of the corresponding processors; a plurality of common terminals shared by the plurality of debug interfaces; a selection circuit capable of selectively connecting the plurality of debug interfaces to the common terminals; and a controller capable of controlling selecting operation in the selection circuit in accordance with a predetermined instruction. A first selector capable of selectively connecting the plurality of debug interfaces to a TRST terminal in the terminal group conformed with the JTAG specifications, and a second selector capable of selectively connecting the plurality of debug interfaces to terminals other than the TRST terminal are provided. With the configuration, even in the case where the number of processors increases, the invention can flexibly address the increase.

7 Claims, 9 Drawing Sheets

FIG. 9

| ADDITIONAL INSTRUCTION | CODE [7:0] |
|---|---|
| ACCESS TO TAP SELECTION REGISTER | 0010_1000 |
| ACCESS TO TRST SELECTION REGISTER | 1010_1000 |

FIG. 10

| ADDITIONAL INSTRUCTION | CODE [11:0] |
|---|---|
| ACCESS TO TAP SELECTION REGISTER (DESIGNATE "n" AS TAP SELECTION VALUE) | nnnn_0010_1000 |
| ACCESS TO TRST SELECTION REGISTER (DESIGNATE "n" AS TRST SELECTION VALUE) | nnnn_1010_1000 |

FIG. 11

| ADDITIONAL INSTRUCTION | CODE [7:0] |
|---|---|
| ACCESS TO TAP SELECTION REGISTER | 0010_1000 |
| ACCESS TO TRST SELECTION REGISTER | 1010_1000 |
| INITIALIZE TAP SELECTION REGISTER | 0110_1000 |

US 7,743,278 B2

TEST ACCESS CONTROL FOR PLURAL PROCESSORS OF AN INTEGRATED CIRCUIT

CROSS-REFERENCE TO RELATED APPLICATION

The present application claims priority from Japanese patent application No. 2005-341958 filed on Nov. 28, 2005, the content of which is hereby incorporated by reference into this application.

BACKGROUND OF THE INVENTION

The present invention relates to a semiconductor integrated circuit device including a plurality of microprocessors and, more particularly, to a technique for facilitating debugging in the semiconductor integrated circuit device.

A semiconductor integrated circuit device in which a plurality of microprocessors are formed on a single semiconductor substrate is a technique attracting attention in recent years.

As a method of debugging a semiconductor integrated circuit device including a plurality of microprocessors, a first technique is known in which a group of debug terminals of the same number as that of mounted processors is provide for a semiconductor integrated circuit device, and debugging devices are connected to the terminals, thereby individually debugging any of the processors by using the corresponding debugging device. A second technique is also known in which a debug terminal group is provided for a semiconductor integrated circuit device, and TAP controllers connected to processors are connected in series, thereby debugging all of the processors by using one debugging device (refer to, for example, the second and third paragraphs in Japanese Unexamined Patent Publication No. 2004-164367).

Further, a third technique is also known which provides: a plurality of processors; a debug executing unit for executing debugging of the plurality of processors; a TAP (Test Access Port) for controlling the debug executing unit; a terminal group connected to an external debugging apparatus; and a selector for selecting at least one or all of processors to be subjected to the debugging. With the configuration, a processor to be debugged can be selected (refer to, for example, the nine and subsequent paragraphs in Japanese Unexamined Patent Publication No. 2004-164367).

SUMMARY OF THE INVENTION

In the first technique, when the number of processors mounted increases, it becomes necessary to add a debug terminal group and a debugging apparatus accordingly, so that the cost increases. In the second technique, all of processors are debugged always via all of the TAP controllers, so that time required for debugging is long. On the other hand, in the third technique, the processors to be debugged are switched, so that the problems of the first and second techniques do not occur.

However, when the inventors of the present invention have examined the third technique, it was found out that the case where the number of CPUs to be debugged increases is not sufficiently considered. For example, when the number of CPUs to be mounted increases due to a change in the specifications of a microcomputer or the like, the logic configuration of the selector is expected to be complicated, and it is difficult to flexibly address the increase in the number of CPUs.

An object of the present invention is to provide a technique for facilitating debugging in a semiconductor integrated circuit device including a plurality of microprocessors.

Another object of the present invention is to provide a technique capable of flexibly addressing an increase in the number of CPUs to be debugged in a semiconductor integrated circuit device which can be debugged by a single emulator.

The above and other objects of the present invention and novel features will become apparent from the description of the specification and the appended drawings.

An outline of a typical one of inventions disclosed in the application will be briefly described as follows.

A semiconductor integrated circuit device includes: a plurality of processors; a plurality of debug interfaces disposed in correspondence with the processors and enabling debugging the corresponding processors; a plurality of common terminals shared by the plurality of debug interfaces; a selection circuit capable of selectively connecting the plurality of debug interfaces to the common terminals; and a controller capable of controlling selecting operation in the selection circuit in accordance with a predetermined instruction. The plurality of common terminals are set as a test terminal group, and the selection circuit includes: a first selector capable of selectively connecting the plurality of debug interfaces to a predetermined terminal in the test terminal group, and a second selector capable of selectively connecting the plurality of debug interfaces to terminals other than the predetermined terminal in the test terminal group.

With the means, as the debug interfaces, existing debug interfaces can be used. Moreover, by using additional instructions, the debug interfaces can be selected. Consequently, the object of the invention to flexibly address the case where the number of processors increases can be achieved. Thus, facilitation of debugging in the semiconductor integrated circuit device in which a plurality of microprocessors are provided in a single semiconductor substrate is achieved.

When a signal of the predetermined terminal in the test terminal group is asserted, the controller resets a connection state between a terminal other than the predetermined terminal in the test terminal group and the debug interface to an initial state.

The controller may include: a first selection register capable of holding information for selectively coupling the plurality of debug interfaces to the predetermined terminal in the test terminal group; and a second selection register capable of holding information for selectively coupling the plurality of debug interfaces to a terminal other than the predetermined terminal in the test terminal group. The first selector selectively couples the plurality of debug interfaces to the predetermined terminal in the test terminal group on the basis of the information held in the first selection register, and the second selector selectively couples the plurality of debug interfaces to a terminal other than the predetermined terminal in the test terminal group on the basis of the information held in the second selection register.

The first selector may include: a first decoder for decoding the information held in the first selection register, and a first multiplexer capable of switching a signal transmission path among the predetermined terminal and the plurality of debug interfaces on the basis of a result of the decoding of the first decoder.

The second selector may include: a second decoder for decoding the information held in the second selection register, and a second multiplexer capable of switching a signal transmission path between terminals other than the predetermined terminal in the test terminal group and the plurality of debug interfaces on the basis of a result of the decoding of the second decoder.

To flexibly address various system debugs by enabling a state after cancellation of resetting to be arbitrary changed, the controller may include a third register capable of defining a state after cancellation of resetting of the plurality of processors.

To avoid undesirable increase in the number of external terminals of the semiconductor integrated circuit device including the plurality of microprocessors, the controller may include a fourth register capable of holding terminal control information for selectively coupling a signal output terminal from the plurality of processors to the common terminal.

When the test terminal group is a terminal group conformed to JTAG specifications, the predetermined terminal in the terminal group conformed to the JTAG specifications is a reset terminal.

An effect obtained by the representative one of the inventions disclosed in the application will be briefly described as follows.

The present invention can provide a technique capable of flexibly addressing an increase in the number of microprocessors to be debugged in a semiconductor integrated circuit device including a plurality of microprocessors. It can facilitate debugging in the semiconductor integrated circuit device including a plurality of microprocessors.

BRIEF DESCRIPTION OF THE DRAWINGS

FIG. 9 is a diagram illustrating instructions to be added in the microcomputer.

FIG. 10 is another diagram illustrating the instructions to be added in the microcomputer.

FIG. 11 is another diagram illustrating instructions to be added in the microcomputer.

DETAILED DESCRIPTION OF THE PREFERRED EMBODIMENTS

Figure 5:
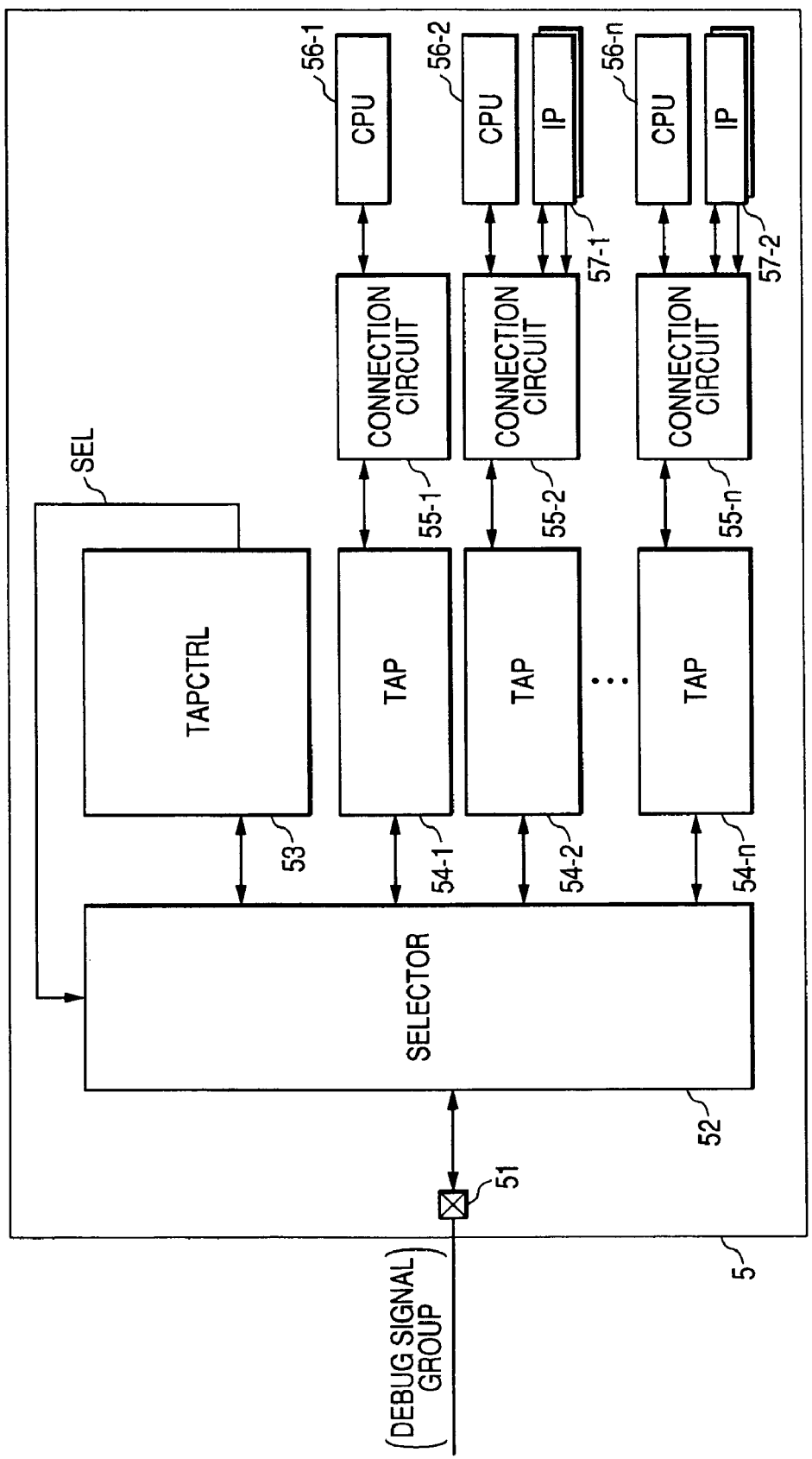
FIG. 5 is a block diagram showing a general configuration example of the microcomputer.

FIG. 5 shows a microcomputer as an example of a semiconductor integrated circuit device according to the present invention.

A microcomputer 5 shown in FIG. 5 includes, although not limited, a selector 52, a TAP controller (TAPCTRL) 53, (n+1) pieces of TAPs (Test Access Ports) 54-1, 54-2, . . . , and 54-n, connection circuits 55-1, 55-2, . . . , and 55-n, CPUs (Central Processing Units) 56-1, 56-2, . . . , and 56-n, and IP (Intellectual Property) modules 57-1 and 57-2 and, although not limited, is formed on a single semiconductor substrate such as a single-crystal silicon substrate by the known semiconductor integrated circuit manufacturing technique.

The selector 52 switches the TAPs 54-1, 54-2, and 54-n to which a JTAG (Joint Test Action Group) terminal group 51 as a test terminal group is connected. The switching is performed in accordance with a selection signal SEL obtained from the TAP controller 53. The CPUs 56-1, 56-2, . . . , and 56-n perform a predetermined computing process in accordance with a preset program. The IP modules 57-1 and 57-2 are function modules designed by using IP data. The connection circuits 55-1, 55-2, and 55-n are connected to the corresponding CPUs 56-1, 56-2, . . . , and 56-n, the function modules 57-1 and 57-2, and the TAPs 54-1, 54-2, . . . , and 54-n so that signals can be transmitted/received to/from the modules. The TAPs 54-1, 54-2, . . . , and 54-n can debug the corresponding CPUs and IP modules by executing a boundary scan on the basis of a debug signal group transmitted via the selector 52. The TAPs 54-1, 54-2, . . . , and 54-n are an example of a debug interface in the invention. The JTAG terminal group 51 enabling the debug signal group to be input/output is provided, and the selector 52 is coupled to the JTAG terminal group 51. To the JTAG terminal group 51, an emulator (not shown) that enables debugging of the CPUs 56-1, 56-2, . . . , and 56-n and the IP modules 57-1 and 57-2 is connected. The emulator controls the debugging function of the microcomputer 5 via the JTAG terminal 51 and collects signals for debugging of the CPUs 56-1, 56-2, . . . , and 56-n and the function modules 57-1 and 57-2 by the boundary scan.

Figure 1:
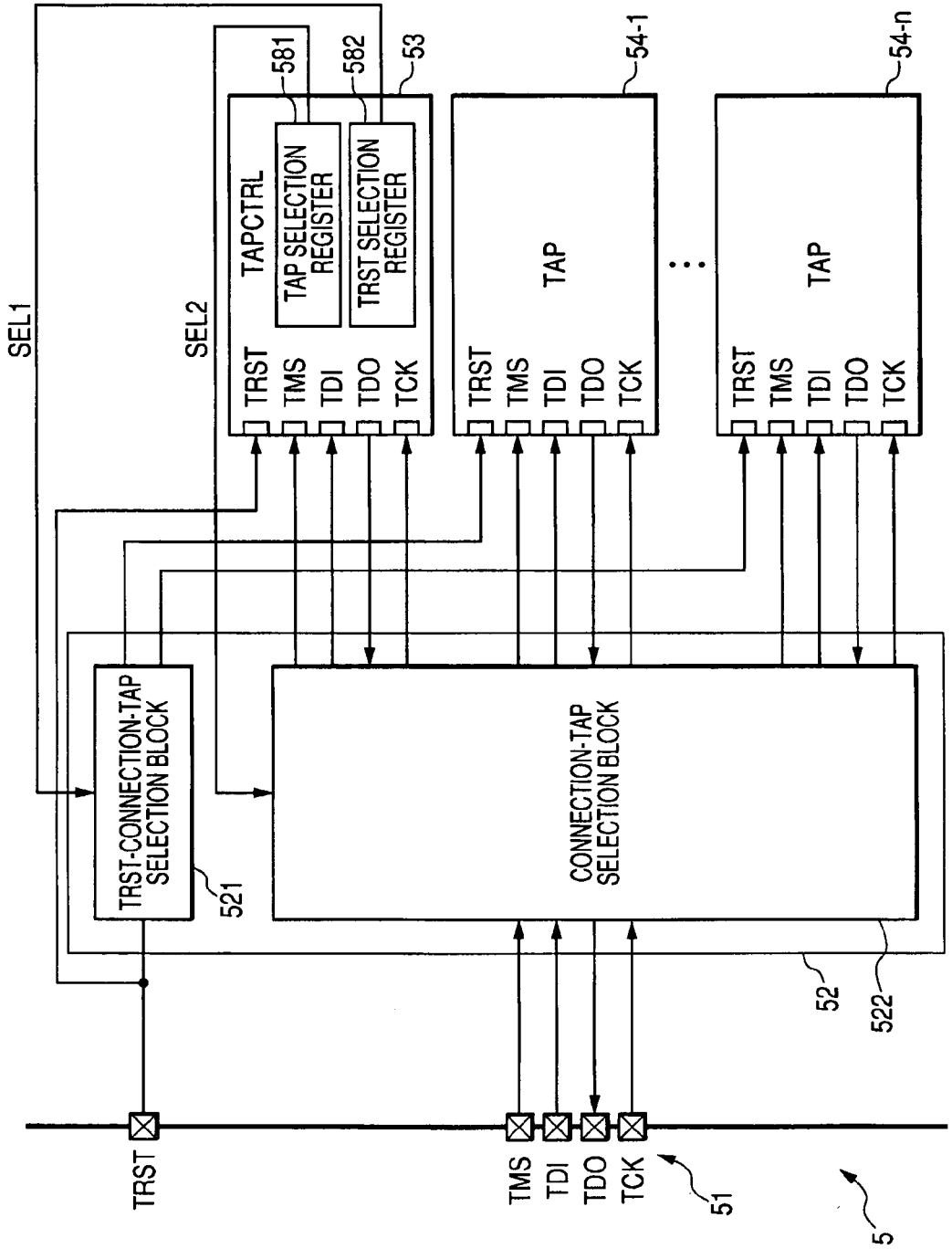
FIG. 1 is a block diagram showing a configuration example of a main part of a microcomputer as an example of a semiconductor integrated circuit device according to the present invention.

FIG. 1 shows a configuration example of a main part of the microcomputer 5.

The selector 52 includes a TRST-connection-TAP selection block 521 and a connection-TAP selection block 522.

The JTAG terminal group 51 is a predetermined JTAG terminal group including a TRST terminal as a test reset terminal, a TMS terminal as a test mode setting terminal, a TDI terminal as a test data input terminal, a TDO terminal as a test data output terminal, and a TCK terminal as a test clock input terminal. The JTAG terminal group 51 is shared by the TAP controller 53 and the TAPs 54-1, . . . , and 54-n through the mediation of the selector 52. The selector 52 includes the TRST-connection TAP selection block 521 for selecting a TRST connection TAP and the connection-TAP selection block 522 for selecting the connection TAP.

The TAP controller 53 includes terminals corresponding to the JTAG terminal group 51, specifically, the TRST terminal, TMS terminal, TDI terminal, TDO terminal, and TCK terminal, a TAP selection register 581 to which TAP selection information can be written, and a TRST selection register 582 to which TRST selection information can be written. The TAPs 54-1 to 54-n include terminals corresponding to the JTAG terminal group, specifically, the TRST terminal, TMS terminal, TDI terminal, TDO terminal, and TCK terminal. The terminals are coupled to the JTAG terminal group 51 via the selector 52.

The TAP controller 53 includes the TAP selection register 581 capable of holding the TAP selection information, and the TRST selection register 582 capable of holding the TRST selection information. The TAP selection information held in the TAP selection register 581 is referred to in a connection-TAP selection control in the connection-TAP selection block 522, and the TRST selection information held in the TRST selection register 582 is referred to in a TRST connection TAP selection control in the TRST connection TAP selection block 521.

Specifically, the connection-TAP selection block 522 connects a TAP terminal designated by the information held in the TAP selection register 581 to a corresponding terminal (TMS terminal, TDI terminal, TDO terminal, and TCK terminal) in the JTAG terminal group 51. Although not limited, in the embodiment, the TAP controller 53 is selected as the default after power on, and connected to the JTAG terminal group 51. The TAP controller 53 has the function of accessing (writing/reading data to/from) the TAP selection register for designating the TAPs 54-1 to 54-n. The TAP selection register 581 is initialized when a signal (TRS signal) from the TRST terminal is asserted.

The TRST-connection-TAP selection block 521 connects the TRST terminal to a TAP designated by the information held in the TRST selection register 582. The TRST terminal of a TAP which is not designated by the TRST selection register 582 is fixed to the logical value "1" or "0" in order to prevent erroneous operation. A plurality of TAPs can be selected by the TRST selection register 582.

Figure 2:
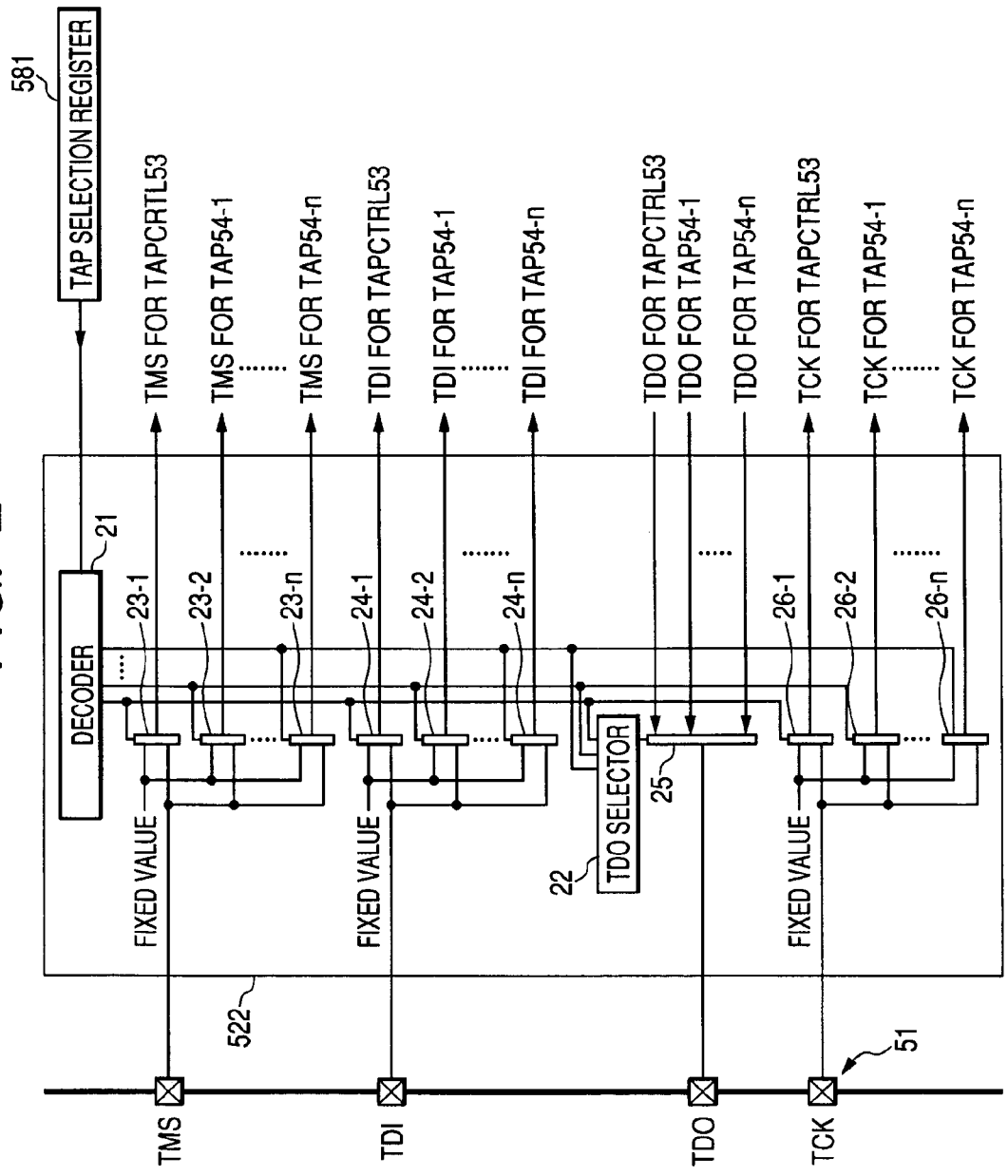
FIG. 2 is a circuit diagram showing a detailed configuration example of a connection-TAP selection block in FIG. 1.

FIG. 2 shows a configuration example of the connection-TAP selection block 522.

The connection-TAP selection block 522 includes, although not limited, a decoder 21 for decoding TAP selection information which is set in the TAP selection register 581, multiplexers 23-1, 23-2, . . . , and 23-n, 24-1, 24-2, . . . , and 24-n, and 26-1, 26-2, . . . , and 26-n enabling a signal transmission path to be switched on the basis of a decoded output signal of the decoder 21, a TDO selector 22 for generating a TDO selection signal generated by logical operation on the decoded output signal of the decoder 21, and a multiplexer 25 operated and controlled by the TDO selection signal generated by the TDO selector 22. The TMS terminal is selectively connected to the TAP controller 53 or any of the TAPs 54-1 to 54-n by the multiplexers 23-1, 23-2, . . . , and 23-n. The TDI terminal is selectively connected to the TAP controller 53 or any of the TAPs 54-1 to 54-n by the multiplexers 24-1, 24-2, . . . , and 24-n. The TCK terminal is selectively coupled to the TAP controller 53 or any of the TAPs 54-1 to 54-n by the multiplexers 26-1, 26-2, and 26-n. The TDO output signal from the TAP controller 53 or any of the TAPs 54-1 to 54-n is selectively transmitted to the TDO terminal by the multiplexer 25. Further, one of input terminals of each of the multiplexers 23-1, 23-2, . . . , and 23-n, 24-1, 24-2, . . . and 24-n, and 26-1, 26-2, . . . , and 26-n is fixed to the logical value "1" or "0". As a result, the logical value of a terminal which is not designated by the TAP selection register 581 can be prevented from becoming undefined.

Figure 3:
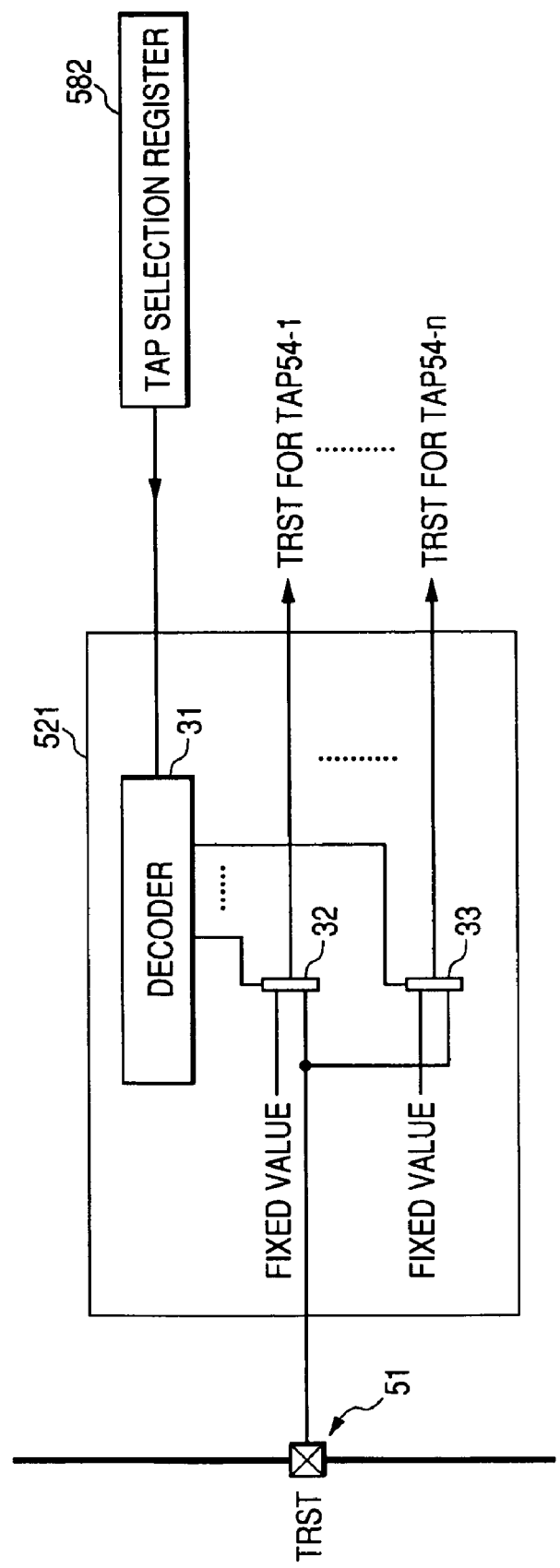
FIG. 3 is a circuit diagram showing a detailed configuration example of a TRST-connection-TAP selection block in FIG. 1.

FIG. 3 shows a configuration example of the TRST-connection-TAP selection block 521.

The TRST-connection-TAP selection block 521 includes, although not limited, a decoder 31 capable of decoding TRST selection information that is set in the TRST selection register 582, and multiplexers 32 and 33 capable of switching a signal transmission path on the basis of a decoded output signal of the decoder 31.

The operation of the configuration will now be described.

The basic flow of debugging is as follows.

Although not shown, an emulator is connected to the JTAG terminal group 51. The TAP controller 53 having the function of accessing the TAP selection register 581 is selected as the default. When a value is set in the TAP selection register 581 by the TAP controller 53, a desired TAP is selected and debugging on the CPU corresponding to the selected TAP is performed by the emulator. After completion of the debugging, the TRST signal is asserted by the emulator, thereby switching the terminal connection from the desired TAP to the TAP controller 53.

The debugging will be concretely described. As an example, the case of sequentially debugging the CPUs corresponding to the TAPs 54-1 and 54-2 will be described.

The not-shown emulator asserts the TRST signal at power-on to initialize the microcomputer 5. By the initial value of the TAP selection register 581, the TAP controller 53 is selectively connected to the TMS terminal, TDI terminal, TDO terminal, and TCK terminal in the JTAG terminal group 51. By the initial value of the TRST selection register 582, the TRST terminal in the JTAG terminal group 51 is connected to all of the TAPs 54-1 to 54-n, so that the TRST signal is supplied to all of the TAPs. As a result, the TAPs 54-1 to 54-n are initialized.

The emulator connected to the JTAG terminal group 51 sets an instruction of an access from the JTAG terminal group 51 to the TRST selection register 582 for the TAP controller 53 selected by the default, and sets information into the TRST selection register 582.

The emulator sets an instruction of an access from the JTAG terminal group 51 to the TAP selection register and sets a value indicative of selection of the TAP 54-1 into the TAP selection register. As a result, the TMS terminal, TDI terminal, TDO terminal, and TCK terminal in the JTAG terminal group 51 are connected to the TAP 54-1.

The emulator is connected to the TAP 54-1 via the JTAG terminal group 5, and debugging on the CPU 56-1 is performed via the TAP 54-1 and the connection circuit 55-1.

After completion of the debugging of the CPU 56-1 corresponding to the TAP 54-1, the debugging is switched to the CPU 56-2 corresponding to the TAP 54-2.

First, the emulator asserts the TRST signal, thereby initializing the TAP selection register 581. As a result, the TAP controller 53 is selected. The emulator sets an instruction of an access to the TAP selection register 581 via the JTAG terminal group 5, and sets a value designating the TAP 54-2 into the TAP selection register 581. As a result, the TMS terminal, TDI terminal, TDO terminal, and TCK terminal in the JTAG terminal group 51 are connected to the TAP 54-2. Consequently, the emulator is connected to the TAP 54-2 via the JTAG terminal group 51, and debugs the CPU 56-2 via the TAP 54-2 and the connection circuit 55-2.

After the debugging on the CPU 56-2 corresponding to the TAP 54-2 is finished, the emulator asserts the TRST signal from the TRST terminal. It makes the TAP selection register 581 initialized and, as a result, in place of the TAP 54-2, the TAP controller 53 is connected to the TMS terminal, TDI terminal, TDO terminal, and TCK terminal in the JTAG terminal group 51.

Information is written to the TAP selection register 581 and the TRST selection register 582 by a new instruction. In this case, the TAP controller 53 is constructed as shown in FIG. 6.

Figure 6:
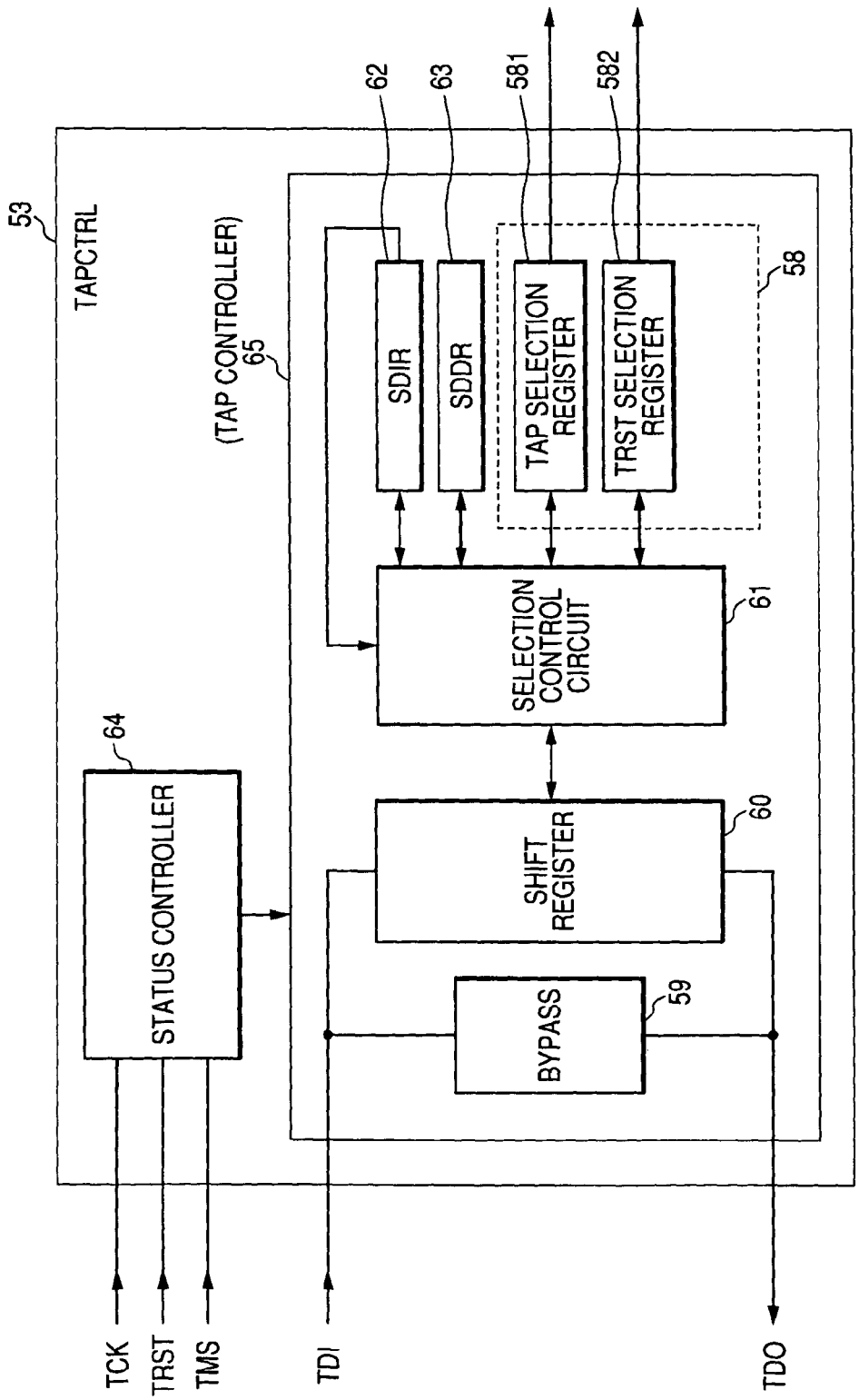
FIG. 6 is a block diagram showing another configuration example of the main part in the microcomputer.

FIG. 6 shows another configuration example of the TAP controller 53.

As shown in FIG. 6, the TAP controller 53 includes a TAP controller 65 for controlling input/output of serial data via the TDI terminal and the TDO terminal, and a status controller 64 capable of controlling the TAP controller 65 on the basis of signals from the TCK terminal, TRST terminal, and TMS terminal.

The TAP controller 65 includes a shift register 60 capable of sequentially shifting data synchronously with clock signals, a bypass 59 capable of bypassing the shift register 60, a signal storage 58 including various registers, a selection control circuit 61 capable of selecting the various registers in the signal storage 58, a JTAG instruction register (SDIR) 62 capable of holding an instruction in the JTAG, and a JTAG data register (SDDR) 63 capable of holding data in the JTAG. In the signal storage 58, the TAP selection register 581 and the TRST selection register 582 are formed. The selection control circuit 61 selects a register in the signal storage 58 in accordance with the instruction held in the SDIR 62. The register selected by the register selecting operation is connected to the shift register 60, and data is transmitted/received to/from the shift register 60.

In the TAP controller 53, an access to the TAP selection register 581 or the TRST selection register 582 can be made by an additional instruction as described below.

As a first example of an access to the TAP selection register 581 or the TRST selection register 582, as shown in FIG. 9, an access to the TAP selection resister and an access to the TRST selection register are set as additional instructions. By the additional instructions, a resistor access can be made. At this time, the emulator issues a TAP selection register access instruction or a TRST selection register access instruction. In the case of issuing the instruction via the JTAG, a TAP status transition instruction register path is selected, and the TAP selection register access instruction or the TRST selection register access instruction is set in the SDIR 62. The TAP status transition data register path is selected, and the information to be set in the TAP selection register 581 or the TRST selection register 582 is written in the SDDR 63. The information held in the SDDR 63 is transferred to the TAP selection register 581 or the TRST register 582.

As a second example of an access to the TAP selection register 581 or the TRST selection register 582, as shown in FIG. 10, an access to the TAP selection resister ("n" is designated as a TAP selection value) and an access to the TRST selection register ("n" is designated as a TRST selection value) are set as additional instructions. By the additional instructions, a resistor access can be made. At this time, the emulator issues a TAP selection register access instruction including a value (in this case, "n") indicative of a TAP to be selected. In the case of issuing the instruction via the JTAG, a TAP status transition IR path is selected, and the instruction is set in the SDIR 62. Based on the instruction, the TAP selection register 581 and the TRST selection register 582 are set.

Another method of TAP selection will now be described.

Figure 4:
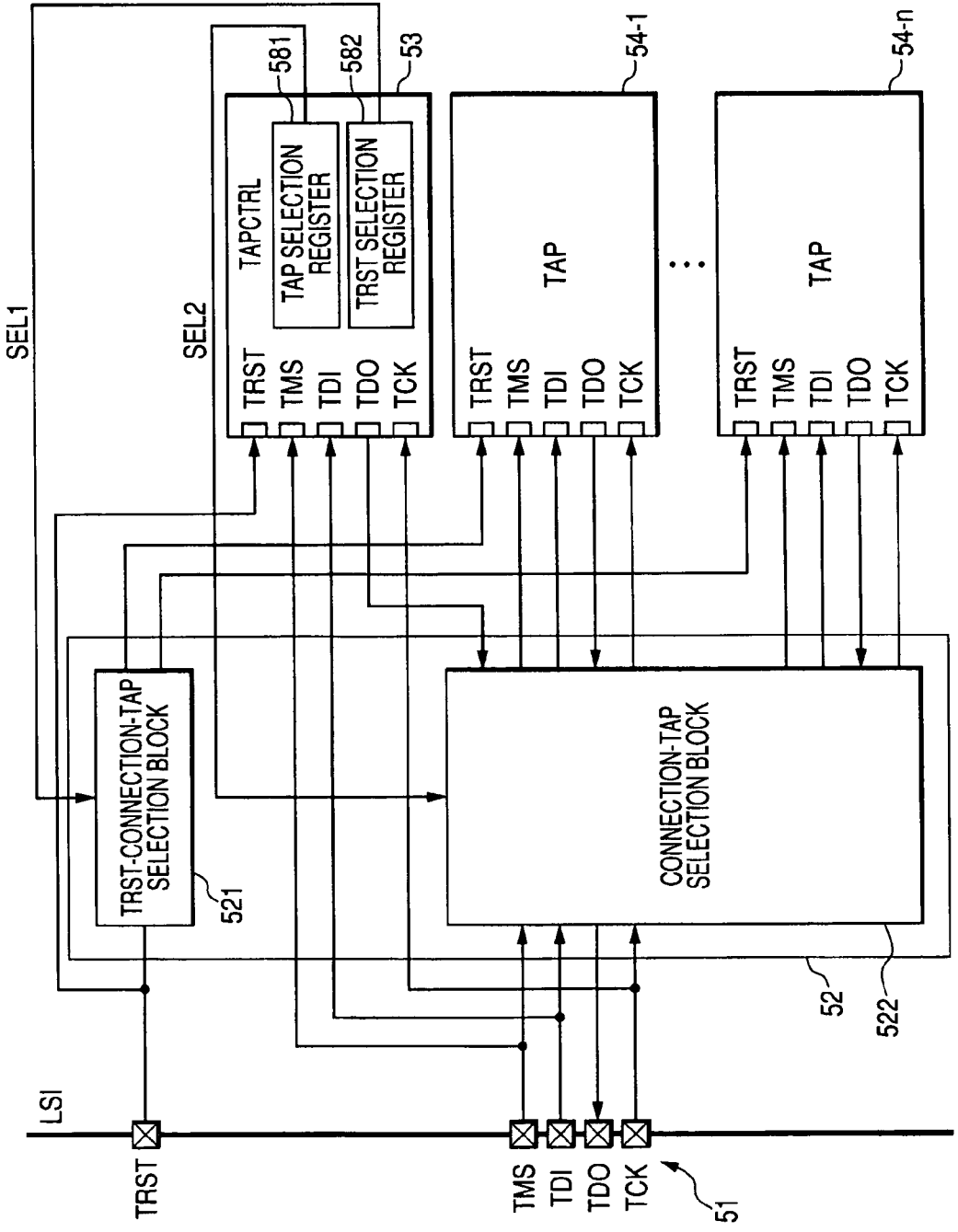
FIG. 4 is a block diagram showing another configuration example of the main part of the microcomputer as an example of the semiconductor integrated circuit device according to the invention.

FIG. 4 shows a configuration example of the main part in the microcomputer 5.

FIG. 4 is largely different from FIG. 1 with respect to the point that signals of the TMS terminal, TDI terminal, and TCK terminal in the JTAG terminal group 51 are always supplied to the TAP controller 53. In this example, the TRST is not used for switching the TAPs, but one or more TAPs always monitor(s) the JTAG terminal. In this case, as shown in FIG. 9, the access to the TAP selection register and the access to the TRST selection register are set as additional instructions, and an access to the register is made by the additional instructions.

The TAP controller 53 always monitors the JTAG terminal. The TAP controller 53 always monitors the JTAG terminal also in the period in which a TAP other than the TAP controller 53 is selected by the TAP selection register. When an instruction of accessing the TAP selection register is received, the TAP selection register value is updated in accordance with the instruction. The instruction of accessing the TAP selection register is expressed by an exclusive code different from all of the TAP instructions.

The operation of the configuration will be described. In the example, debugging is performed while sequentially switching function circuits connected to TAP1 and TAP3.

The emulator operates the TRST signal at power-on to execute initialization. In the TAP selection register 581, a value of connecting the TAP controller 53 is set. In the TRST selection register 582, a value of connecting the TRST terminal to all of the TAPs 54-1 to 54-n is set, and all of the TAPs 54-1 to 54-n are initialized.

The emulator sets an instruction of an access from the JTAG terminal to the TRST selection register 582 into the TAP controller 53 selected as the default, and a value indicative of connection of the TRST is set for the TAP controller 53.

The emulator sets an instruction of an access to the TAP selection register 581 via the JTAG terminal group 51, and sets a value indicative of selection of the TAP 54-1 into the TAP selection register 582. As a result, the TMS terminal, TDI terminal, TDO terminal, and TCK terminal are connected to the TAP 54-1.

The emulator is connected to the TAP 54-1 via the JTAG terminal group 51 so that the emulator can debug the CPU 56-1 corresponding to the TAP 54-1.

After completion of the debugging on the CPU 56-1 corresponding to the TAP 54-1, debugging on the CPU 56-2 corresponding to the TAP 54-2 is performed. First, the emulator sets an instruction of an access from the JTAG terminal to the TAP selection register and, next, sets a value indicative of selection of the TAP 3 into the TAP selection register. The TAP controller 53 always monitors the JTAG terminal group 51, and it enables the operation to be performed. The emulator is connected to the TAP 54-2 via the JTAG terminal group 51. Thus, the emulator can debug the CPU 56-2 corresponding to the TAP 54-2.

There is another TAP switching method in which, as shown in FIG. 11, an instruction of initializing the TAP selection register is added to the TAP controller 53. The instruction of initializing the TAP selection register is expressed as an exclusive code different from all of the TAP instructions. The TAP controller 53 always monitors the JTAG terminal also in the period in which a TAP other than the TAP controller 53 is selected by the TAP selection register and, when the instruction of initializing the TAP selection register is received, initializes the TAP selection register. In such a manner, the TAP controller 53 is selected.

In the configuration example shown in FIG. 4, different from that of FIG. 1, the TRST signal is not used for selecting a TAP. In the example shown in FIG. 1, positive use of the TRST signal under control of each TAP is limited. However, the operation frequencies of the TAPs can be made independent of one another, so that there is an advantage from the viewpoint of implementation. On the other hand, in the configuration shown in FIG. 4, by selecting a TAP selection instruction which is not used in all of the TAPs, the flexibility in utility is higher only by an amount that initialization is not performed with the TRST signal as compared with the example shown in FIG. 1.

By the above-described example, the following effects can be obtained.

(1) Irrespective of the presence of the plurality of CPUs 56-1 to 56-n in the microcomputer 5, system debugging on the plurality of CPUs 56-1 to 56-n can be performed by a single emulator corresponding to the JTAG.

(2) Generally, TAPs are provided in correspondence with CPUs in a microcomputer. As the TAPs 54-1 to 54-n, the existing TAPS can be used as they are. Moreover, by using additional instructions, TAP selection is performed. Consequently, even in the case where the number of CPUs increases, the invention can flexibly address the increase.

(3) By the effects (1) and (2), debugging in the microcomputer can be facilitated.

Next, another configuration example of the microcomputer 5 will be described.

Figure 7:
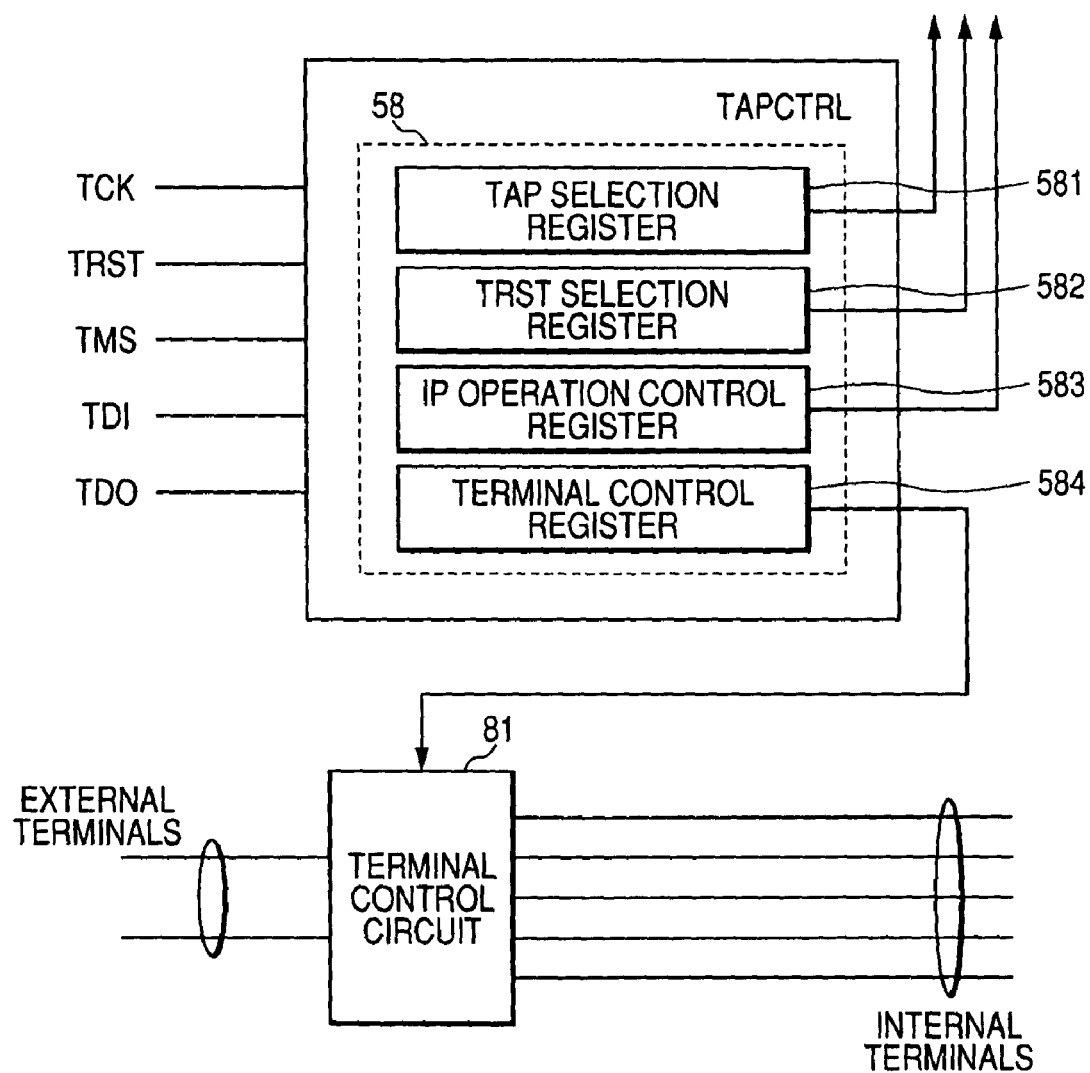
FIG. 7 is a diagram showing operations of an operation control register in FIG. 6.

As shown in FIG. 7, an operation control register 583 and a terminal control register 584 can be added in the signal storage 58. Like the TAP selection register 581 and the TRST register 582, the operation control register 583 and the terminal control register 584 can be selected and controlled by the selection control circuit 61. By additional instructions equivalent to the TAP selection register access and the TRST register access, an access from the emulator via the JTAG terminal group 51 can be made.

The terminal control register 584 can hold information for controlling a terminal control circuit 81 interposed between an external terminal and an internal terminal in the microcomputer 5 as shown in FIG. 7. According to the held information, the terminal control circuit 81 controls the correspondence relation in connection between the external terminal and the internal terminal. In other words, by the control of the terminal control circuit 81 based on the information held in the terminal control register 584, the internal terminals are selectively connected to the external terminals. The internal terminals include terminals in the TAPs 54-1 to 54-n, terminals in the CPUs 56-1 to 56-n, and terminals in the IP modules 57-1 and 57-2. The external terminals include the JTAG terminal group 51 and not-shown other external terminals.

There is a case where a plurality of CPUs need signals playing similar roles. An example of such signals is a break signal which is asserted in the case where a predetermined break condition is satisfied in execution of a user program. Break signals of the number corresponding to the number of CPUs internally provided are necessary. However, it is not realistic to provide external terminals for outputting break signals for the microcomputer 5 in correspondence with the break signals because the number of pins becomes enormous. To address the problem, the terminal control circuit 81 is interposed so that a single external terminal is shared by the plurality of CPUs. With the configuration, break signals from the CPUs are selectively output to the outside. It can avoid undesirable increase in the external terminals of the microcomputer 5.

Also in the case of outputting not only the break signals but also a signal for trace in debugging and the like to the outside, the terminal control by the terminal control circuit 81 is valid.

Figure 8:
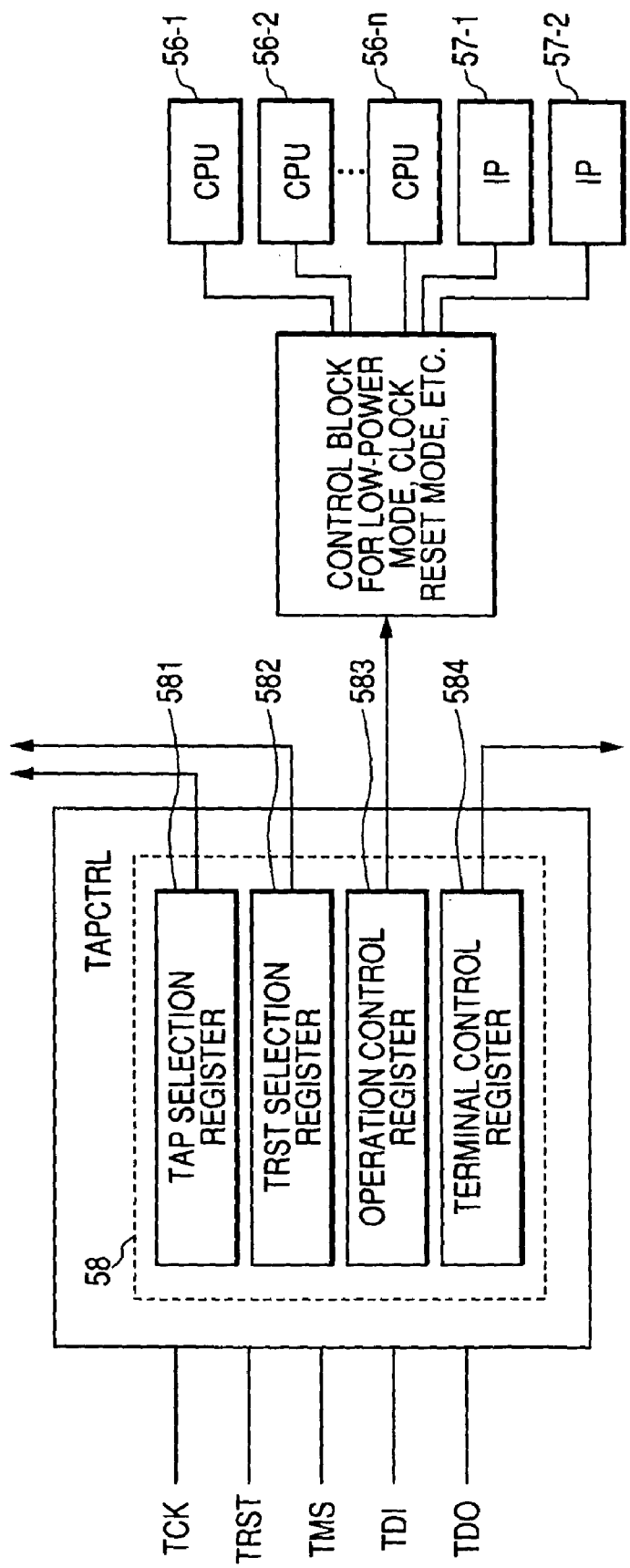
FIG. 8 is a diagram showing operations of a terminal control register in FIG. 6.

The operation control register 583 holds the initial state, that is, a state after cancellation of resetting of the CPUs 56-1 to 56-n and the IP modules 57-1 and 57-n, for example, as shown in FIG. 8. The initial state can be defined by a low-power mode or not, clock frequency, reset state or not, operation mode, a block to be controlled, and the like. For example, (A) a state in which a command fetch is started by a reset vector after reset cancellation, and (B) a state in which the state shifts to a module stop state after reset cancellation can be defined as a state. Before cancellation of resetting of each of the CPUs, the register 583 is set via the JTAG. The setting can be made by a predetermined instruction in a manner similar to the other registers in the signal storage 58. After cancellation of resetting, the clock control modules in the CPUs 56-1 to 56-n fetch a state of the bit, and determine the following operation. For example, at the time of debugging, the pre-defined master/slave relations among the CPUs can be changed.

In the case of employing the configuration shown in FIG. 8, the state after reset cancellation of the CPUs 56-1 to 56-n and the IP modules 57-1 and 57-n can be arbitrarily changed according to the information held in the operation control register 583. Thus, the invention can flexibly address to various system debugs.

Although the invention made by the inventors herein has been concretely described above, obviously, the invention is not limited to the embodiment but can be variously changed without departing from the gist.

For example, although the case where the device is constructed by a single semiconductor substrate has been described above, the device may be also constructed by a plurality of semiconductor substrates.

Although the case of applying the invention achieved by the inventors herein to a microcomputer in the field of utilization as the background of the invention has been described above, the invention is not limited to the case but can be widely applied to a semiconductor integrated circuit device including a plurality of processors.

The present invention can be applied to a device on condition that the device includes a plurality of processors.

What is claimed is:

1. A semiconductor integrated circuit device comprising:
    a plurality of processors;
    a plurality of debug interfaces disposed in correspondence with the processors and enabling debugging the corresponding processors;
    a plurality of common terminals shared by the plurality of debug interfaces;
    a selection circuit capable of selectively connecting the plurality of debug interfaces to the common terminals; and
    a controller capable of controlling selecting operation in the selection circuit in accordance with a predetermined instruction,
    wherein the plurality of common terminals are set as a test terminal group,
    wherein the selection circuit includes:
        a first selector capable of selectively connecting the plurality of debug interfaces to a predetermined terminal in the test terminal group; and
        a second selector capable of selectively connecting the plurality of debug interfaces to terminals other than the predetermined terminal in the test terminal group, and
    wherein when a signal of the predetermined terminal is asserted, the controller resets a connection state between a terminal other than the predetermined terminal in the test terminal group and the debug interface to an initial state.

2. The semiconductor integrated circuit device according to claim 1,
    wherein the controller comprises:
        a first selection register capable of holding information for selectively coupling the plurality of debug interfaces to the predetermined terminal; and
        a second selection register capable of holding information for selectively coupling the plurality of debug interfaces to a terminal other than the predetermined terminal in the test terminal group,
    wherein the first selector selectively couples the plurality of debug interfaces to the predetermined terminal based on the information held in the first selection register, and
    wherein the second selector selectively couples the plurality of debug interfaces to a terminal other than the predetermined terminal in the test terminal group based on the information held in the second selection register.

3. The semiconductor integrated circuit device according to claim 2, wherein the first selector comprises:
    a first decoder for decoding the information held in the first selection register; and
    a first multiplexer capable of switching a signal transmission path between the predetermined terminal and the plurality of debug interfaces based on a result of the decoding of the first decoder.

4. The semiconductor integrated circuit device according to claim 2,
wherein the second selector comprises:
    a second decoder for decoding the information held in the second selection register; and
    a second multiplexer capable of switching a signal transmission path between terminals other than the predetermined terminal in the test terminal group and the plurality of debug interfaces based on a result of the decoding of the second decoder.

5. The semiconductor integrated circuit device according to claim 1, wherein the controller includes a third register capable of defining a state after cancellation of resetting of the plurality of processors.

6. The semiconductor integrated circuit device according to claim 1, wherein the controller includes a fourth register capable of holding terminal control information for selectively coupling respective signal output terminals of the plurality of processors to a common terminal.

7. The semiconductor integrated circuit device according to claim 1,
    wherein the test terminal group is a terminal group conformed to JTAG specifications, and
    wherein the predetermined terminal in the terminal group conformed to the JTAG specifications is a reset terminal.

\* \* \* \* \*